(12) United States Patent
DeVries, Jr. et al.

(10) Patent No.: US 7,224,153 B2
(45) Date of Patent: May 29, 2007

(54) APPARATUS AND METHOD TO COMPENSATE FOR EFFECTS OF LOAD CAPACITANCE ON POWER REGULATOR

(75) Inventors: Charles Allen DeVries, Jr., Lisle, IL (US); Joseph Gerard Renauer, Naperville, IL (US); Michael G. Amaro, Naperville, IL (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/114,442

(22) Filed: Apr. 26, 2005

(65) Prior Publication Data

US 2006/0238183 A1    Oct. 26, 2006

(51) Int. Cl.
*G05F 1/00* (2006.01)
*H02J 1/00* (2006.01)

(52) U.S. Cl. .................. 323/284; 323/351; 323/354
(58) Field of Classification Search ........... 323/282, 323/284, 351, 353, 354
See application file for complete search history.

(56) References Cited

U.S. PATENT DOCUMENTS

| | | | | |
|---|---|---|---|---|
| 4,216,434 A | * | 8/1980 | Wermuth | 330/86 |
| 4,447,780 A | * | 5/1984 | Youmans et al. | 324/132 |
| 5,146,154 A | * | 9/1992 | Lippmann et al. | 323/367 |
| 5,345,171 A | * | 9/1994 | Simmons et al. | 324/166 |
| 5,744,984 A | * | 4/1998 | Drapac et al. | 327/89 |
| 5,859,526 A | * | 1/1999 | Do et al. | 323/280 |
| 6,181,120 B1 | * | 1/2001 | Hawkes et al. | 323/282 |
| 6,407,630 B1 | * | 6/2002 | Yao et al. | 330/9 |
| 6,680,604 B2 | * | 1/2004 | Muratov et al. | 323/285 |
| 6,917,190 B2 | * | 7/2005 | Matsuo et al. | 323/287 |
| 6,919,715 B2 | * | 7/2005 | Muratov et al. | 323/285 |

* cited by examiner

*Primary Examiner*—Bao Q. Vu
(74) *Attorney, Agent, or Firm*—W. James Brady, III; Frederick J. Telecky, Jr.

(57) ABSTRACT

A power regulator has an output for regulated power that is connected to supply power to a load. The load can have various electrical characteristics, including requiring a rapid transient response. The transient response amplitude for the power regulator is decreased by adding capacitance at the output, but that slows the response time of the power regulator by lowering the crossover frequency and the phase margin at the crossover frequency. An adjustable gain element imbedded in the feedback network provides an input to permit a builder or user of the power regulator to vary the effective value of impedance elements in the feedback network. The builder or user selectively connects an impedance to the input of the adjustable gain element to thereby adjust the frequency characteristics of the feedback network to thereby adjust output characteristics of the power regulator to compensate for the effects of capacitance added to the power regulator output. The selective connection of various impedances to the input in the variable gain element adjusts the gain in the feedback circuit so to change the frequency of the gain and output phase of the regulator. Proper adjustment of the variable gain raises the crossover frequency and the phase margin, restoring the performance that was degraded by the added capacitance at the output.

4 Claims, 6 Drawing Sheets ns of US 7,224,153 B2

APPARATUS AND METHOD TO COMPENSATE FOR EFFECTS OF LOAD CAPACITANCE ON POWER REGULATOR

BACKGROUND OF THE INVENTION

1. Field of the Invention

The present invention relates generally to an electrical power regulator, and more particularly to a power regulator having an adjustable feedback loop, to an adjustable feedback loop for a power regulator, and to a method for adjusting a feedback loop of a power regulator.

2. Description of the Related Art

Power regulators are used in many electrical devices to provide controlled power to the circuits in the device. The power regulators may be used to translate the voltage to a desired level, to regulate the power to a particular output level, or the like. Power regulators are configured according to several different designs. One such design is a switching power regulator, where an input voltage is switched on and off rapidly and then is smoothed to provide an output voltage at a lower level. Regulators generally use a feedback control loop that in many configurations includes an error amplifier to compare the output voltage of the regulator with a reference value to maintain tight control of the output.

A power regulator 80 is shown generally in FIG. 8a, including an input 82, a power conversion stage 84, and an output 86. The power conversion stage 84 has an output that is fed through a feedback network 88 to an error amplifier 90 that in turn feeds a controller 92 which controls the power conversion stage 84.

One of the critical parameters in developing a power regulator is transient response, most commonly defined as the deviation in output voltage due to a change in the load current. Another way to look at transient response is as the time that it takes the regulator to return the output voltage to a steady-state condition after a load change. Three variables that affect transient response are: 1) $C_{out}$—the amount of output capacitance, 2) $f_C$—the overall regulator 0 dB feedback loop crossover frequency, and 3) PM—the phase margin at the crossover frequency $f_C$.

The output capacitance $C_{out}$ determines how far the output voltage moves (dV) until the regulator feedback responds to the deviation. The crossover frequency $f_C$ determines the time that it takes for the regulator to responds to the deviation. The phase margin PM is a measure of the damping of the response to the deviation. As an example, a switching power regulator with a switching frequency $f_{sw}$ of 350 kHz may be designed with 100 μF of output capacitance $C_{out}$ and a crossover frequency $f_C$ of 60 kHz with a phase margin PM of 45° in order to achieve a critically damped response to a 50% load current step of 100 mV with a recovery time of 75 μs.

For some loads, and especially for forthcoming DSPs (Digital Signal Processors), μPs (microprocessors), ASICs (Application-Specific Integrated Circuits), and FPGAs (Field Programmable Gate-Arrays), this level of transient deviation may be too high. A typical core voltage for a DSP (digital signal processor) may be 1.2V, with an allowable cumulative deviation of only ±3%, which equates to only a 36 mV transient deviation.

In order to achieve such a small transient response, it is necessary to provide many additional output capacitors which provide additional hold-up time until the regulator feedback loop can respond. This technique may require thousands of μF (microfarads) of capacitance. These additional capacitors are generally populated on the circuit board(s) of the device.

However, applying these additional capacitors to the output has four drawbacks. The first two are simple. First, adding the extra capacitors takes up a lot of space on the printed circuit board (PCB). Second, the extra capacitors add a lot of cost to the overall BOM (Bill of Materials) for building such as device.

The third and fourth drawbacks have to do with the inter-relatedness of the crossover frequency $f_C$ and the phase margin PM to the output capacitance $C_{out}$. For a given design, adding additional capacitance results in, thirdly, a lower crossover frequency $f_C$ (slowing the response time of the regulator), and fourthly, a high likelihood of lowered phase margin PM (causing unstable operation).

Because of the third drawback, as a builder of such a device progressively adds output capacitors, there is only a small reduction in transient amplitude. The benefit of a lower voltage change over time dV/dt is counteracted by the slower response time due to a decreased crossover frequency $f_C$.

An example of this effect is apparent from FIGS. 1a, 1b and 1c and the graph of FIG. 2. In FIG. 1a, an example of a power conversion stage of a power regulator is shown schematically, including an inductor 20 and a branch to ground having a capacitor 22 and a resistor 24. The resistor represents the intrinsic ESR (Equivalent Series Resistance) of the capacitor. The capacitor 22 here is 100 μF and the resistor is 5 milliohm. The capacitance has been increased in FIG. 1b by the addition of a branch having a capacitor 26 of 940 μF and an ESR resistance of 3 milliohm. A further increase in capacitance is provided in FIG. 1c, wherein the second branch has a 6000 μF capacitor 30 and a 1.5 milliohm ESR resistance 32. FIGS. 1b and 1c represent additional capacitance provided by the user to the power conversion stage of FIG. 1a.

The frequency response of the power conversion stage of the power regulator is shown in FIGS. 2 and 3. In particular, in a graph 34 of gain over frequency, the gain of the regulator is graphed for different output capacitances. The crossover frequency is indicated for each graph as the zero crossing point. The crossover frequency for the circuit of FIG. 1a is shown at 36, the crossover frequency for the circuit of FIG. 1b is shown at 38, and the crossover frequency for the circuit of FIG. 1c is shown at 40. Thus, the crossover frequency $f_C$ decreases with increasing output capacitance $C_{out}$.

Because of the fourth drawback, as a builder progressively adds output capacitors, there is an increasing likelihood of instability. Adding output capacitors lowers the double-pole LC resonant frequency/phase transition frequency, which fixed feedback networks have decreasing ability to compensate for.

FIG. 3 illustrates the phase change with increases in the output capacitance. In particular, the graph 42 of phase over frequency shows the power conversion stage phase for each of the circuits of FIGS. 1a, 1b and 1c. In particular, the phase transition frequency for the circuit of FIG. 1a is shown at 44, for the circuit of FIG. 1b at 46 and for the circuit of FIG. 1c at 48. The phase transition frequency decreases with increasing output capacitance $C_{out}$.

SUMMARY OF THE INVENTION

The present invention provides a power regulator that is adjustable for load capacitance. In particular, the feedback circuit of the power regulator includes an adjustment that permits a user to change at least one of the gain (or attenuation) and the phase characteristics of the power regulator. The adjustment changes the location of a "zero" frequency at which the gain and phase are increased.

An embodiment of the invention solves the problem of decreasing power conversion stage crossover frequency in the presence of output capacitance added by the user to achieve satisfactory transient response, without causing undesirable problems for the user.

DETAILED DESCRIPTION OF THE PREFERRED EMBODIMENTS

Power regulators, such as modular power regulators, generally have fixed compensation, and offer no means of adjusting the feedback parameters to compensate for large amounts of added output capacitance. The conventional solution to this problem is to devise custom compensation values for the internal feedback frequency tailoring components that would be optimum for a narrow range of output capacitance. The present circuit and method allows the user a simple means of adjusting the feedback loop for optimum performance with a given amount of output capacitance, without reliance on a custom solution.

Figure 8A:
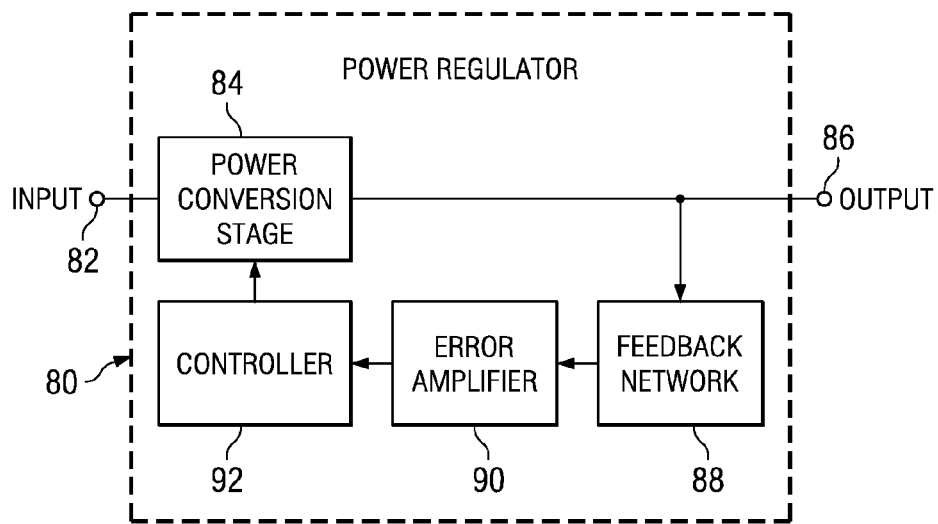
FIG. 8a is a functional block diagram of a typical power regulator.
Figure 8B:
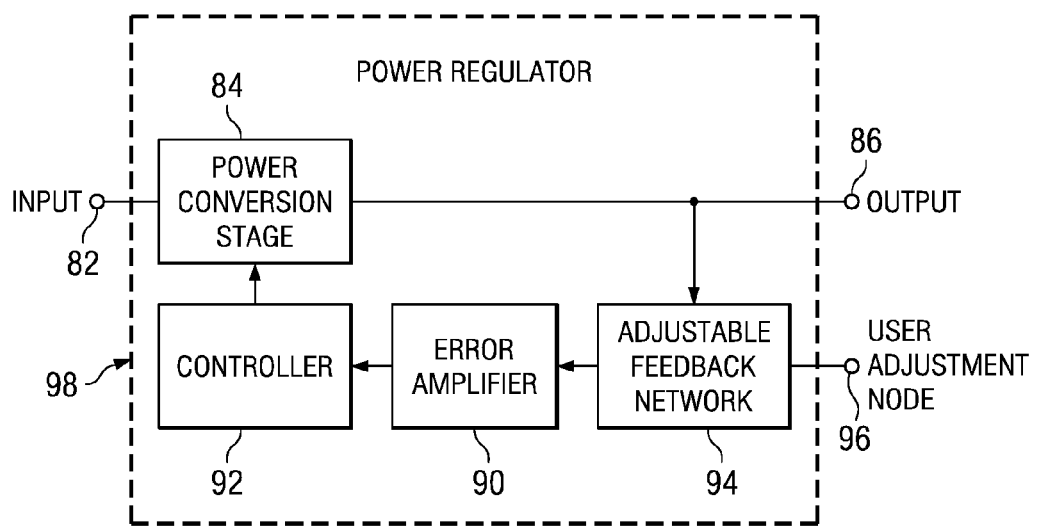
FIG. 8b is a functional block diagram of a power regulator utilizing the present invention.

The present apparatus and method allows the builder or user to purchase an off-the-shelf voltage regulator and tailor the bandwidth of the product by adjusting the value of a single component in the circuit. Referring to FIG. 8b, in which the same reference characters are used for the same or similar components as shown in FIG. 8a, a power regulator 98 has an input 82 for receiving unregulated power and an output 86 at which is produced regulated power. The input power 82 is supplied to a power conversion stage 84 to produce the output power. Regulation is assured by a feedback loop from the output 86 that includes an adjustable feedback network 94, an error amplifier 90, and a controller 92. The controller 92 is connected to a control input of the power conversion stage 84. The embodiment of FIG. 8b has a user adjustment node 96 as an input to the adjustable feedback network 94. The user may thereby adjust the gain or attenuation in the feedback loop to accommodate various load characteristics. In particular, by allowing optimized bandwidth tailoring of the regulator for a given amount of output capacitance, far better transient performance can be obtained with far less output capacitance.

Figure 1A:
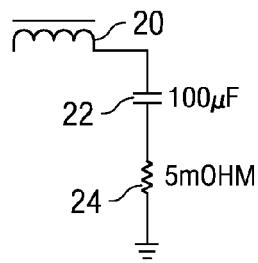
FIGS. 1a, 1b and 1c are equivalent circuit diagrams of a power regulator output having progressively increasing capacitance connected thereto according to the prior art.
Figure 1B:
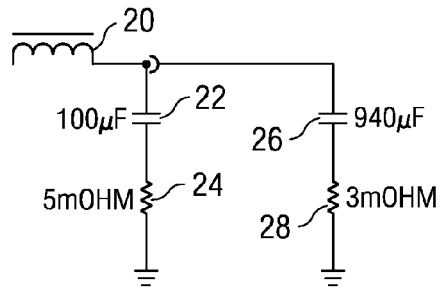
Figure 1C:
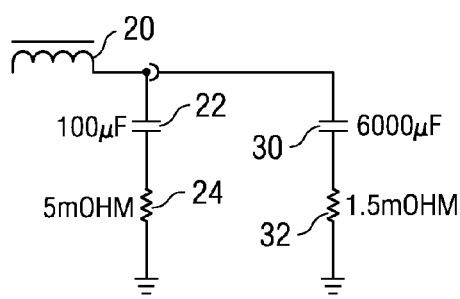
Figure 4:
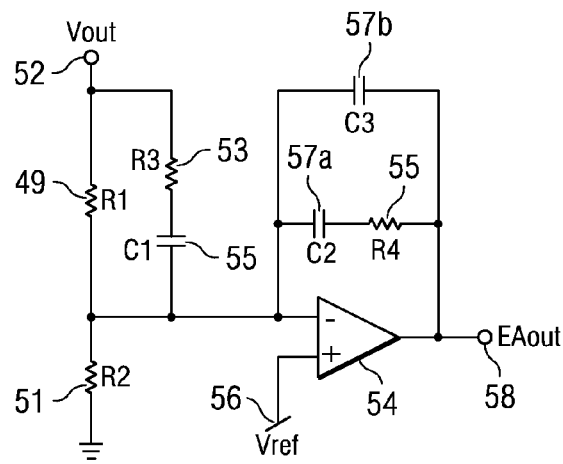
FIG. 4 is a circuit diagram of a known feedback circuit for a power regulator.

The present invention provides, in the preferred embodiments, a solution to the problems set forth above and provides a builder or user of a power regulator the flexibility to adjust the feedback circuit in such a way as to compensate for any added capacitance. To accomplish this according to one aspect of the invention, a variable gain circuit block is inserted in the feedback loop. The variable gain, which is set by the builder or user, manipulates the location of a "zero", which, in feedback terms, controls at what frequencies the feedback network adds additional gain and additional phase. The builder or user can change the gain (or attenuation) of the circuit block (see FIG. 5, the component K, also denoted 60), which lowers the frequency of the feedback zero. Compare this to a (normal) non-adjustable feedback circuit as shown in FIG. 4. In FIG. 4, a typical error amplifier configuration used within a power regulator is shown. The various resistors and capacitors set the output voltage and frequency response of the circuit. The optimum frequency response is affected by the amount of capacitance present on the output of the regulator.

Specifically, in the feedback circuit of FIG. 4, an output voltage at 52 is obtained from a power regulator circuit, such as a switched regulator, although other types of regulators are of course possible. The output voltage is fed through a voltage divider of resistors 49 and 51 to an inverting input of an amplifier or comparator 54 which has the non-inverting input connected to a reference voltage 56. The output 58 of the amplifier 54 is provided to an error input of the power regulator. Bias and filtering components including resistors 53 and 50 and capacitors 55, 57a and 57b are provided in the circuit as well. No provision is made in the feedback circuit for adjustment.

Figure 5:
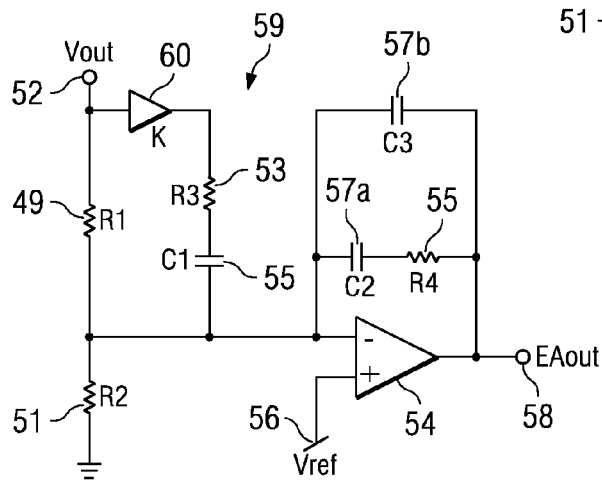
FIG. 5 is a circuit diagram of a feedback circuit having a variable gain buffer that acts as a zero adjuster according to the principles of the present invention.
Figure 2:
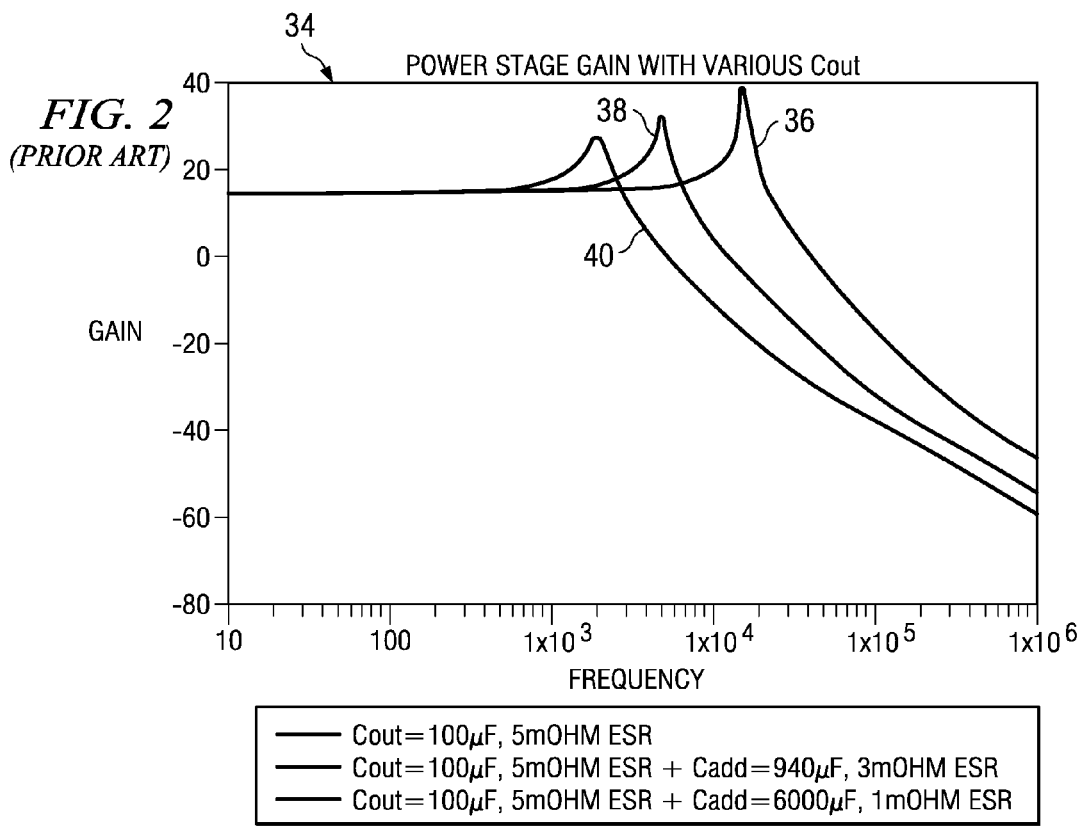
FIG. 2 is a graph of the output stage gain over frequency for the circuits of FIGS. 1a, 1b and 1c.
Figure 3:
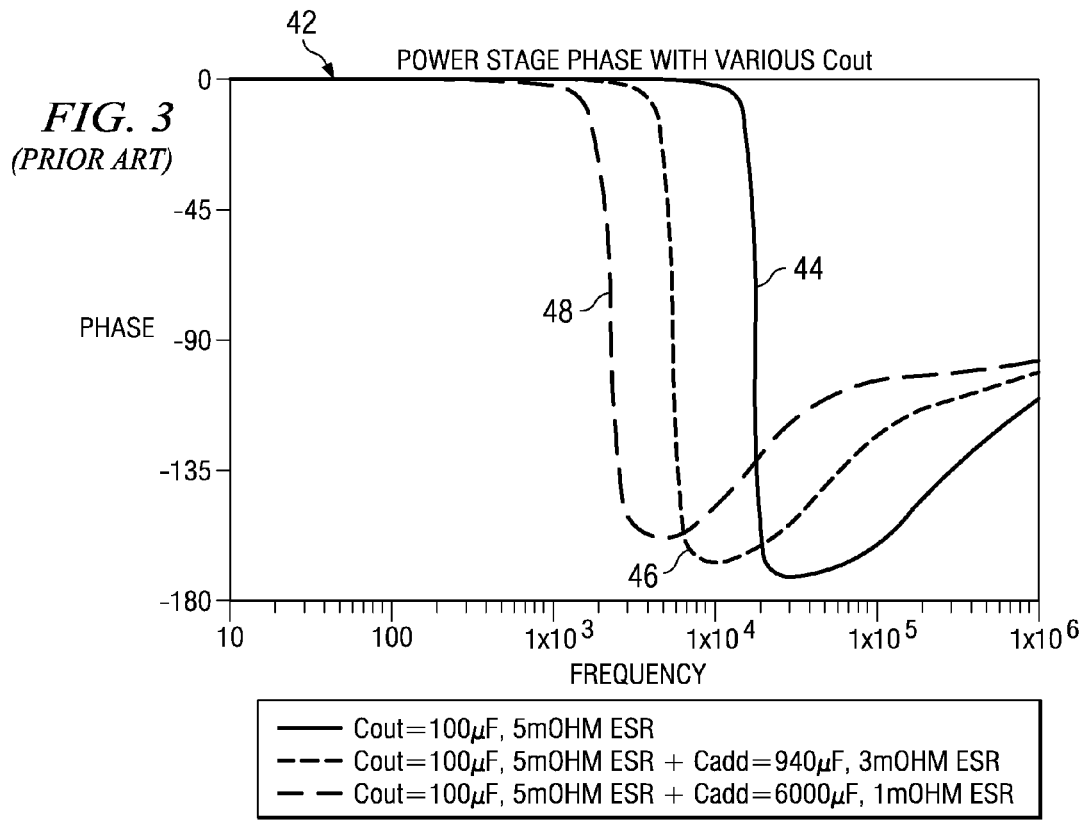
FIG. 3 is a graph of the power stage phase over frequency for the circuits of FIGS. 1a, 1b and 1c.

Referring to FIG. 5, the circuit likewise is a feedback circuit for a power regulator but includes a provision for adjustment. Where the same circuit elements appear as are present in the circuit of FIG. 4, the same reference characters are used. An amplifier 60 is provided having its input connected to receive the output voltage 52 of the power regulator. The amplifier 60 is adjustable to adjust the levels in the feedback loop. More precisely, the changing gain (or attenuation) in the branch having the resistor 53 and the capacitor 55 changes the effective value of the capacitor and resistor in the circuit so as to change the location (the frequency) of the "zero" for the circuit. The amplifier 60 can be an adjustable buffer having an adjustable attenuation or an adjustable gain, either of which will vary the frequency dependent behavior of the feedback network. In the preferred embodiment, the gain of the amplifier 60 is adjustable. Changing the gain of the buffer 60 makes the apparent value of the capacitor 55 and the resistor 53 larger or smaller, depending on the value of the gain supplied by buffer 60.

This changes the frequency location of a pole-zero pair in the transfer function of the circuit, thus altering its frequency response in the frequency dependent path. By properly changing the value of the buffer 60, the frequency response can be optimized for a broad range of output capacitance.

It is also contemplated to provide the adjustable element 60 in the branch containing the resistor 49, such as in series with the resistor 49. Adjustment of the adjustable element will also result in movement of the zero in this configuration. A further embodiment has an adjustable element in both branches so that an adjustable element is in series with the resistor 49 and another is in series with the resistor 53 and capacitor 55. These are just a few of the ways in which the principles of the present invention can be embodied in a circuit, and other such embodiments are encompassed within the scope of this invention.

The elements that are affected by the adjustment of the gain or attenuation of the buffer 60, specifically the resistor 53, capacitor 55 and resistor 49, are referred to here as a frequency dependent network. The frequency dependent network may be configured in many different ways, the illustrated embodiment currently being considered the simplest and most efficient. Other configurations are, within the scope of this invention.

Figure 6:
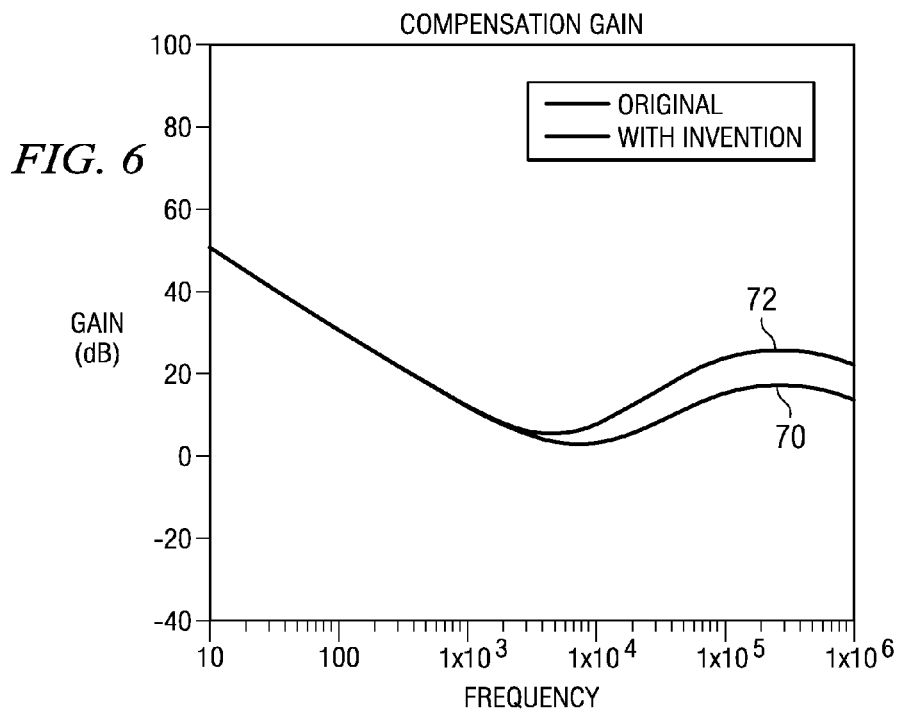
FIG. 6 is a graph of compensation gain over frequency for the circuits of FIGS. 4 and 5.

The addition of this adjustable gain portion to the feedback circuit has a tremendously beneficial effect on the overall feedback loop with the added output capacitance. First, by adding gain, the feedback zero frequency is lowered. See FIG. 6 which shows, at 70, the gain of the circuit without the added portion and, at 72, the additional gain of the circuit obtained with the added portion. The additional gain compensates for the lost gain due to the lower frequency of the LC (inductor-capacitor) double-pole and also maintains the overall crossover frequency $f_C$. Lower voltage changes dV/dt are achieved due to the higher capacitance level, without sacrificing the response time, resulting in tremendously reduced transient deviations. By properly changing the value of gain of the buffer K, the frequency response can be optimized for a broad range of output capacitance.

Figure 7:
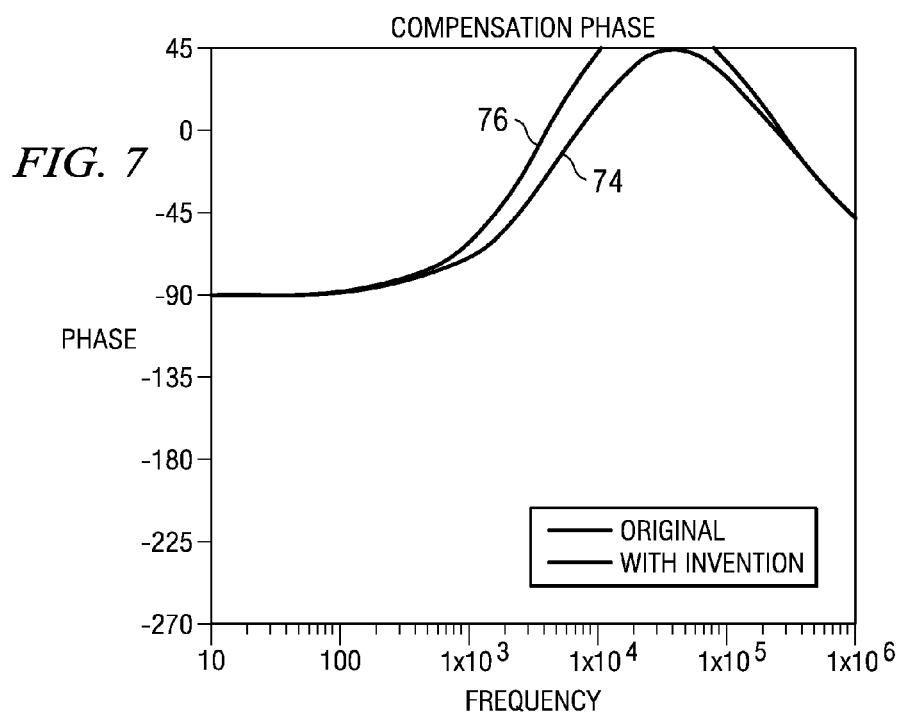
FIG. 7 is a graph of compensation phase over frequency for the circuits of FIGS. 4 and 5.

Secondly, by lowering the feedback zero frequency, a phase lead is added at lower frequencies as can be seen in FIG. 7, which compensates for the lower frequency phase transition point of the LC double-pole. In particular, the phase of the circuit without the additional portion is shown at 74 and the phase of the circuit with the added portion is shown at 76. The change in phase yields adequate phase margin PM at the crossover frequency $f_C$, ensuring stability even with large amounts of low-ESR (Equivalent Series Resistance) capacitors.

As an example, two otherwise identical modules were tested to achieve a transient deviation of 60 mV in response to a step change in load current. The first module, utilizing present techniques, required nearly 6400 uF of capacitance (16 capacitors of various sizes and technologies). Further, the fundamental limitations of the present technique were reached, as additional capacitance had very little effect on further reducing the voltage deviation. The second module, utilizing the approach taught herein, required only 470 uF (1 capacitor) to reach the 60 mV goal. There was still room for improvement; a second 470 uF capacitor was added to achieve a 40 mV deviation. This constitutes a 33% reduction in deviation with less than 15% of the capacitance, equal to a 10× improvement for the builder or user.

Figure 9:
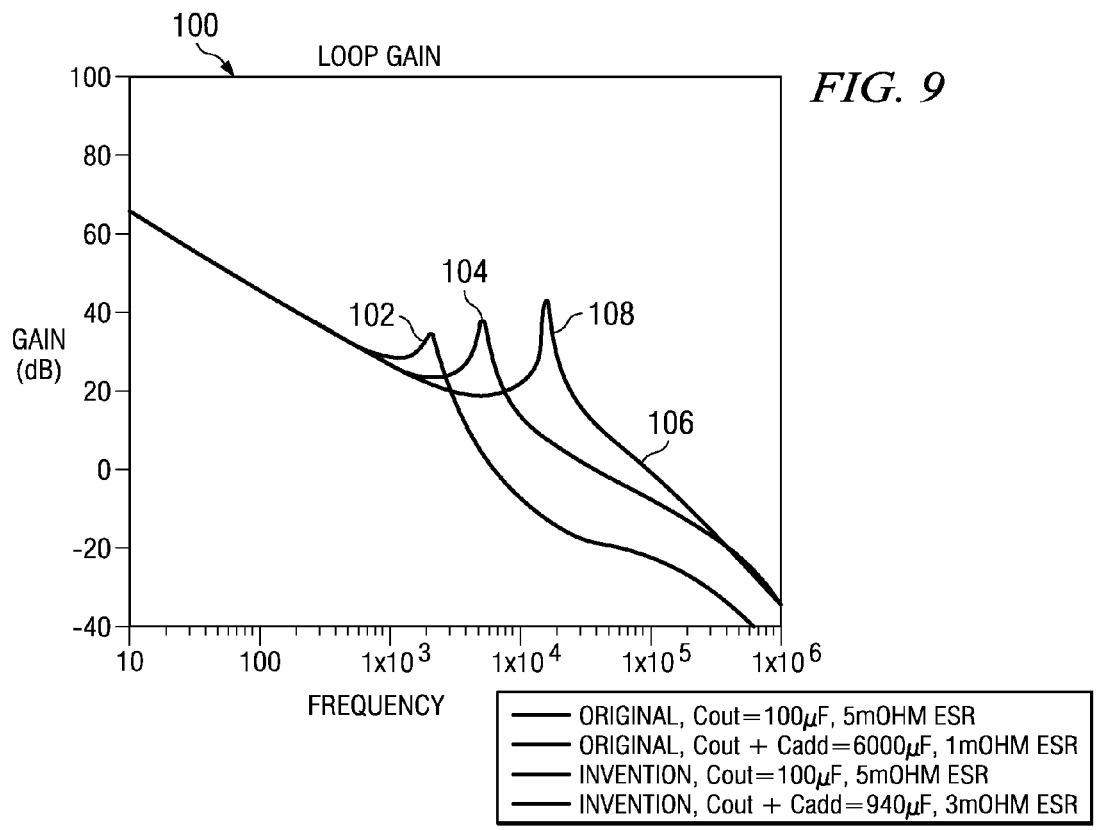
FIG. 9 is a graph of loop gain over frequency comparing the circuits of FIG. 1a, FIG. 1c, and two circuits according to the present invention.

FIG. 9 provides a comparison of the circuits described in the preceding paragraph, wherein the graph 100 includes a line tracing the gain for a circuit having an output capacitance $C_{out}$ of 100 μF at 106 and the gain of the same circuit with the module of the present invention at 108. A further gain is graphed at 102 for the circuit with an output capacitance of 6000 μF without the invention. The gain characteristic 104 is obtained by a circuit having an output capacitance of 940 μF and the module of the present invention. A distinct increase in the frequency of the crossover frequency is seen.

Figure 10:
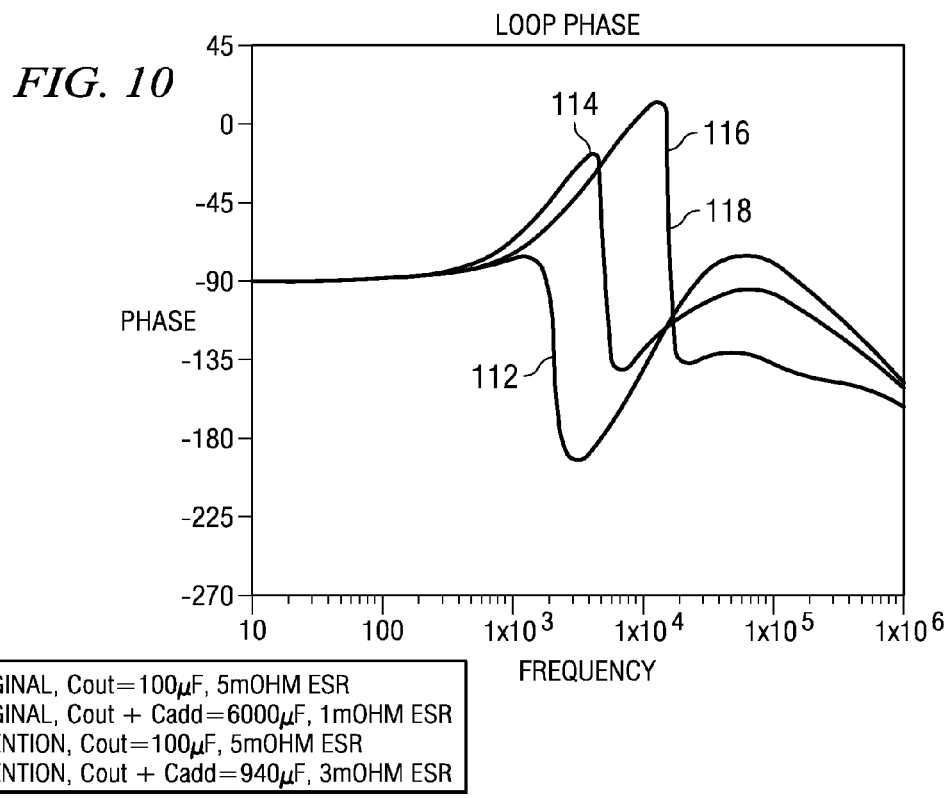
FIG. 10 is a graph of loop phase over frequency comparing the circuits of FIG. 1a, FIG. 1c, and two circuits according to the present invention.

With reference to FIG. 10, a graph 110 of the phase characteristic for the circuit with the output capacitance $C_{out}$ of 100 μF is shown at 116, while the phase characteristic 118 is shown for the same circuit having the present module added. The characteristics are substantially identical for the circuits with and without the module of the present invention. An additional phase characteristic is graphed at 112 for the circuit without the invention and with an added output capacitance of 6000 uF. The phase characteristic 114 is obtained by a circuit having added output capacitance of 940 uF to the original 100 uF and the module of the present invention. A distinct increase in the phase margin is seen.

Figure 11:
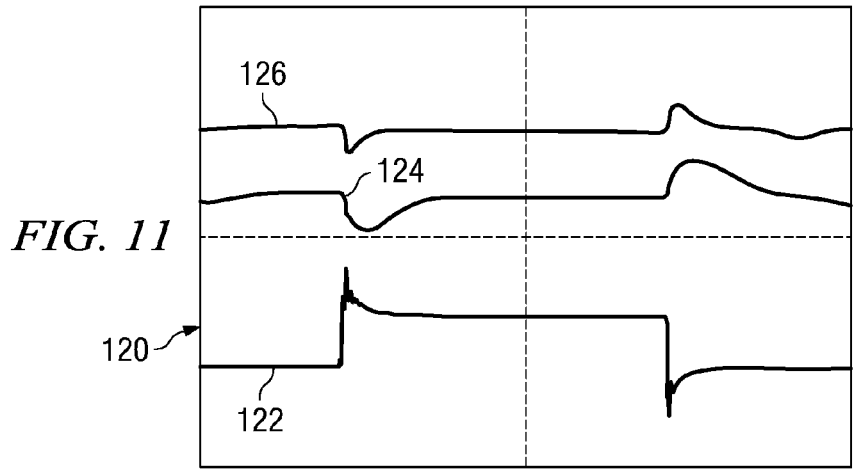
FIG. 11 is a graph of transient response comparing the known circuits to the circuit according to the present invention.

The transient response of various circuits is shown in FIG. 11, wherein the graph 120 shows a current step 122 and a transient response of a power regulator without the present module, as shown at 124. The addition of the present module to the circuit provides a transient response as shown at 126.

Figure 12:
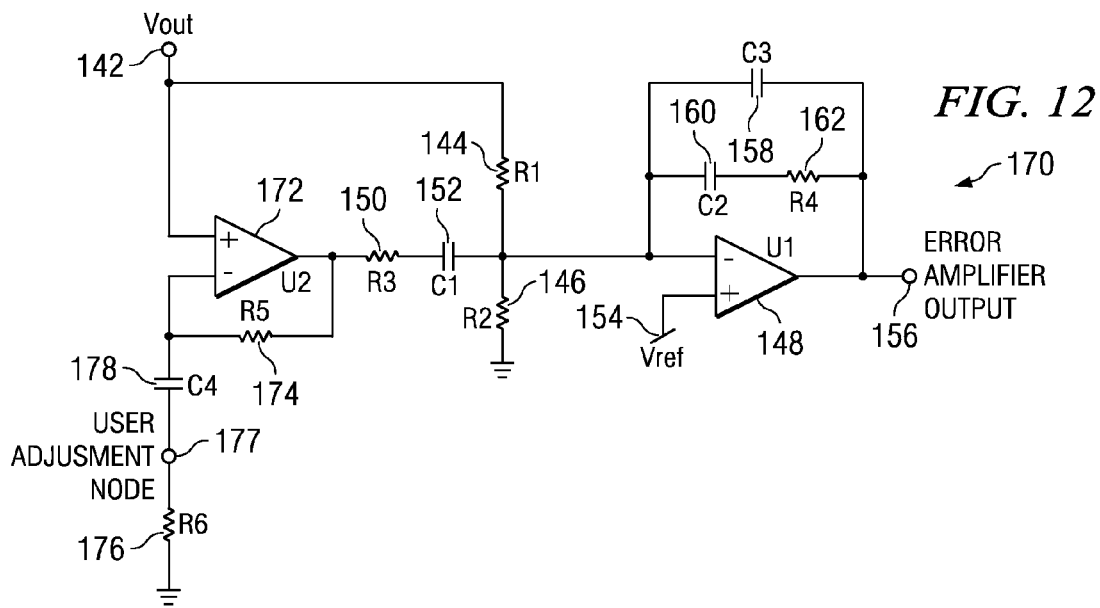
FIG. 12 is a circuit diagram of another embodiment of an error amplifier with a variable gain buffer according to the invention.

Turning to FIG. 12, a circuit 170 has an input 142 to which is connected the output voltage of the power regulator. This output voltage is provided through a voltage divider formed by resistors 144 and 146 to an inverting input of an amplifier 148. A frequency dependant network is also provided for shaping the frequency response, the network including a resistor 150 and a capacitor 152. The non-inverting input of the amplifier 148 is connected to a reference voltage 154. The amplifier output is provided as the error amplifier output 156, which is connected to a control input of the power regulator or to a controller that is connected to the control input of the power regulator. A feedback frequency shaping network is provided by a capacitor 158 as well as by the capacitor 160 and resistor 162. The various resistors and capacitors set the output voltage and frequency response of the error amplifier circuit.

The circuit 170 has a variable gain buffer implemented with an amplifier U2 172 and its associated components, resistor R5 174, resistor R6 176, and capacitor C4 178. The gain of this circuit can be adjusted by the user or builder by changing the value of the resistor R6 176, which is a simple connection from the User Adjustment Node 177 to ground. The lowest gain that can be achieved is 1, when the resistance of the resistor R6 176 is infinite, in other words, when an open circuit is provided. A gain greater than one is set by the ratio of the resistors R5 174 to R6 176. The capacitance C4 178 is used only as a dc blocking capacitor. As the gain is increased, the apparent value of the capacitor C1 152 and the resistor R3 150 is increased.

Figure 13:
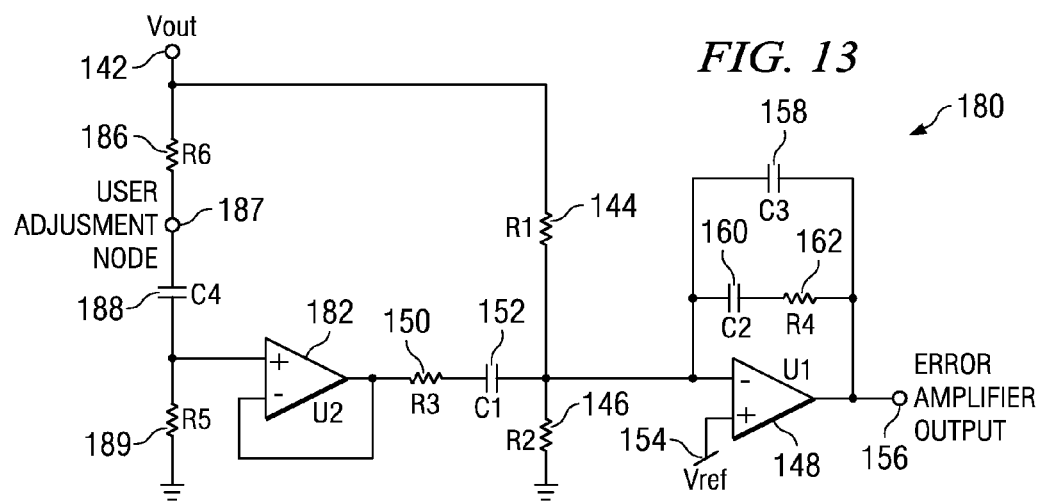
FIG. 13 is a circuit diagram of an error amplifier with a variable attenuation buffer according to the invention.

With reference to FIG. 13, an error amplifier circuit 180 has a variable attenuation that is used to implement the K block, rather than variable gain. A fixed unity gain buffer U2 182 is used to drive frequency shaping components resistor R3 150 and capacitor C1 152. An attenuation network is created with a resistor R5 184 and resistor R6 186. A capacitor C4 188 is used only as a dc blocking capacitor.

When the resistor R6 is zero ohms (a short circuit), the gain is 1. As resistance R6 increases in value, the gain decreases (attenuation increases). The gain (or attenuation) is determined by R5/(R5+R6). In this case, the values of the resistor R3 150 and the capacitor C1 152 should be set to the maximum desired value. As the attenuation of the input signal in increased, the apparent value of the resistor R3 150 and the capacitor C1 152 will decrease. The user or builder would alter the attenuation of the circuit by changing the value of R6, which is a simple connection from the User Adjustment Node 187 to $V_{out}$.

The gain or attenuation buffer can be implemented in a variety of ways or using a variety of components, including transistors, operational amplifiers, FETs and MOSFETs, amplifier circuits, vacuum tubes, or many other designs and components. The buffer operates as a voltage controlled voltage source or current controlled voltage source, or any comparable circuit, all of which are within the scope of this invention.

A feedback adjustment for compensating for the effects of different capacitances at the output of a power regulator is shown. The present invention provides particular utility in switching regulators.

A simple pin is provided on the circuit for connection to a resistor or other circuit element to compensate for capacitive load. A single resistor or other impedance can be used to tune the circuit. Sluggish transient response can be improved without the negative side effects of prior circuits. In particular, the transient response of the circuit is significantly improved by the present invention. The circuit can be tailored to the load and restore the performance of the circuit so that is has an optimal transient response.

Thus, there is shown and described a power regulator that has an output for regulated power that is connected to supply power to a load. The load can have various electrical characteristics, including requiring a rapid transient response. The transient response amplitude for the power regulator is decreased by adding capacitance at the output, but that slows the response time of the power regulator by lowering the crossover frequency and the phase margin at the crossover frequency. An adjustable gain element imbedded in the feedback network provides an input to permit a builder or user of the power regulator to vary the effective value of impedance elements in the feedback network. The builder or user selectively connects an impedance to the input of the adjustable gain element to thereby adjust the frequency characteristics of the feedback network to thereby adjust output characteristics of the power regulator to compensate for the effects of capacitance added to the power regulator output. The selective connection of various impedances to the input in the variable gain element adjusts the gain in the feedback circuit so to change the frequency of the gain and output phase of the regulator. Proper adjustment of the variable gain raises the crossover frequency and the phase margin, restoring the performance that was degraded by the added capacitance at the output.

Although other modifications and changes may be suggested by those skilled in the art, it is the intention of the inventors to embody within the patent warranted hereon all changes and modifications as reasonably and properly come within the scope of their contribution to the art.

We claim:

1. A power regulator circuit, comprising:
    (a) a power conversion stage with a power input node for connection to a power supply and a power output node for connection to a load;
    (b) a controller with output connected to said power conversion stage;
    (c) an error amplifier with output connected to said controller, said error amplifier with a feedback input plus a reference voltage input; and
    (d) an adjustable feedback network with an input connected to said power output node, an output connected to said error amplifier feedback input, and with a user adjustment node for connection to an impedance element, wherein the frequency response of said feedback network is determined by the impedance at said user adjustment node;
    (e) whereby transient response of said power regulator is determined by the capacitance at said power output together with the impedance at said user adjustment node.

2. The power regulator of claim 1, wherein said error amplifier is an operational amplifier with: (i) non-inverting input as said reference voltage input, (ii) inverting input as said feedback input, and (iii) a resistor plus capacitor feedback from output to said inverting input.

3. The power regulator of claim 1, wherein said feedback network includes a variable gain buffer with inputs coupled to said power output node and said user adjustment node and with output coupled to said feedback input of said error amplifier.

4. The power regulator of claim 1, wherein said feedback network includes a unity gain buffer with an input coupled to both said power output node and said user adjustment node and with output coupled to said feedback input of said error amplifier.

* * * * *